(12) United States Patent
Miyashita et al.

(10) Patent No.: US 8,453,600 B2
(45) Date of Patent: Jun. 4, 2013

(54) SUBSTRATE PROCESSING APPARATUS

(75) Inventors: Tomoyasu Miyashita, Toyama (JP); Nobuo Ishimaru, Takaoka (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 1353 days.

(21) Appl. No.: 11/792,864

(22) PCT Filed: Dec. 28, 2005

(86) PCT No.: PCT/JP2005/024046
§ 371 (c)(1), (2), (4) Date: Apr. 25, 2008

(87) PCT Pub. No.: WO2006/077735
PCT Pub. Date: Jul. 27, 2006

(65) Prior Publication Data
US 2009/0071405 A1  Mar. 19, 2009

(30) Foreign Application Priority Data
Dec. 28, 2004 (JP) ................................ 2004-379002

(51) Int. Cl.
| | |
|---|---|
| C23C 16/505 | (2006.01) |
| C23C 16/509 | (2006.01) |
| C23C 16/46 | (2006.01) |
| C23F 1/00 | (2006.01) |
| H01L 21/306 | (2006.01) |
| C23C 16/06 | (2006.01) |
| C23C 16/22 | (2006.01) |

(52) U.S. Cl.
USPC ............... 118/723 I; 118/723 IR; 118/723 E; 118/723 ER; 118/724; 156/345.43; 156/345.44; 156/345.45; 156/345.48

(58) Field of Classification Search
USPC .. 118/723 I, 723 IR, 723 E, 724; 156/345.43, 156/345.44, 345.45, 345.48
See application file for complete search history.

(56) References Cited

U.S. PATENT DOCUMENTS

| | | | | |
|---|---|---|---|---|
| 5,521,351 | A | * | 5/1996 | Mahoney ................ 219/121.59 |
| 5,540,800 | A | | 7/1996 | Qian |
| 5,540,824 | A | * | 7/1996 | Yin et al. ................ 204/298.34 |
| 5,647,913 | A | * | 7/1997 | Blalock ..................... 118/723 I |
| 5,665,167 | A | * | 9/1997 | Deguchi et al. ............ 118/728 |

(Continued)

FOREIGN PATENT DOCUMENTS

| | | |
|---|---|---|
| JP | 8-88220 A | 4/1996 |
| JP | 8-162288 A | 6/1996 |

(Continued)

OTHER PUBLICATIONS

U.S. Appl. No. 10/571,898.

(Continued)

*Primary Examiner* — Rudy Zervigon
(74) *Attorney, Agent, or Firm* — Birch, Stewart, Kolasch & Birch, LLP

(57) ABSTRACT

Disclosed is a substrate processing apparatus, comprising a processing chamber to accommodate one or more substrates, a gas supply section to supply processing gas into the processing chamber, a gas discharge section to discharge the processing gas from the processing chamber, at least a pair of electrodes provided inside the heating section to plasma-excite the processing gas, a protection container made of dielectric to air-tightly accommodate the electrodes, an electricity-receiving section which is electrically connected to the electrodes and which is accommodated in the protection container, and an electricity-feeding section to which high frequency electric power is applied and which is provided near the electricity-receiving section in a state in which at least a wall of the protection container is interposed between the electricity-receiving section and the electricity-feeding section, wherein electric power is supplied from the electricity-feeding section to the electricity-receiving section by electromagnetism coupling.

11 Claims, 23 Drawing Sheets

U.S. PATENT DOCUMENTS

| | | | |
|---|---|---|---|
| 5,698,062 A * | 12/1997 | Sakamoto et al. | 156/345.44 |
| 6,076,482 A * | 6/2000 | Ding et al. | 118/723 R |
| 6,209,480 B1 * | 4/2001 | Moslehi | 118/723 I |
| 6,395,128 B2 * | 5/2002 | Sharan et al. | 156/345.1 |
| 6,568,346 B2 * | 5/2003 | Pu et al. | 118/723 I |
| 6,705,246 B2 * | 3/2004 | Sharan et al. | 118/723 E |
| 7,952,048 B2 * | 5/2011 | Choi et al. | 219/121.57 |
| 7,955,986 B2 * | 6/2011 | Hoffman et al. | 438/714 |
| 8,093,072 B2 * | 1/2012 | Ishimaru | 438/14 |
| 2006/0260544 A1 * | 11/2006 | Toyoda et al. | 118/715 |
| 2010/0130009 A1 * | 5/2010 | Ishimaru | 438/680 |
| 2010/0323507 A1 * | 12/2010 | Toyoda et al. | 438/510 |

FOREIGN PATENT DOCUMENTS

| | | | |
|---|---|---|---|
| JP | 11-509031 A | | 8/1999 |
| JP | 2003-56772 A | | 2/2003 |
| JP | 2004-55446 A | | 2/2004 |
| JP | 2004 124234 | | 4/2004 |
| JP | 2004-124234 A | | 4/2004 |
| JP | 2005 277264 | | 10/2005 |
| JP | 2005-277264 A | | 10/2005 |
| JP | 2006 73913 | | 3/2006 |
| JP | 2006-073913 A | | 3/2006 |
| KR | 2001-0040736 A | | 5/2001 |
| KR | 2003-0079786 A | | 10/2003 |
| WO | WO 97/02588 | | 1/1997 |
| WO | WO-99/40609 A1 | | 8/1999 |

OTHER PUBLICATIONS

U.S. Appl. No. 10/547,320.

* cited by examiner

Inductance: L
Coupling coefficient: K

US 8,453,600 B2

SUBSTRATE PROCESSING APPARATUS

BACKGROUND OF THE INVENTION

1. Field of the Invention

The present invention relates to a substrate processing apparatus, and more particularly, to a substrate processing apparatus for etching a surface of a substrate such as a silicon wafer by utilizing plasma, and for forming a thin film on the surface of the substrate by utilizing plasma.

2. Description of the Related Art

As a substrate processing apparatus for processing a silicon wafer utilizing plasma, there is an apparatus as shown in FIGS. 1 and 2. FIG. 1 is a schematic explanatory transverse sectional view of a vertical type substrate processing furnace of a conventional substrate processing apparatus. FIG. 2 is a schematic vertical sectional view taken along the line A-A in FIG. 1.

A thin and long buffer chamber 237 is provided in a vertical direction near an inner wall surface of a reaction tube 203. In the buffer chamber 237, two rod-like discharge electrodes 269 covered with electrode protection tubes 275 made of dielectric, and a gas nozzle 233 for obtaining a uniform gas flow in the buffer chamber 237 are disposed.

High frequency electric power generated by an oscillator of a high frequency power supply 273 is applied to ends 301 of the discharge electrodes 269 to generate plasma 224 between the discharge electrodes 269 in the buffer chamber 237, and thereby to excite reaction gas supplied from a gas nozzle 233 with plasma, and the plasma-excited reaction gas is supplied to wafers 200 which are substrates to be processed in the reaction tube 203 from a gas supply hole 248a formed in a sidewall of the buffer chamber 237.

While the wafers 200 are processed, gas in the electrode protection tubes 275 is continuously replaced by inert gas to prevent the discharge electrode from being oxidized.

However, the inside of the reaction tube 203 is heated to about 600 to 900° C. to process the wafers 200, and as a result, the discharge electrodes 269 are discolored or deteriorated due to slight residual oxygen in the inert gas in the electrode protection tubes 275 or a sealing failure at a portion from which the discharge electrode 269 is pulled outside, and the performance of the electrodes can not be maintained.

As conventional techniques, other than the above-described technique, there are one in which a flexible electrode (weaved electrode) is used (Japanese Patent Application No. 2004-055446 (International Application No. PCT/JP 2005/002306)), and one in which high frequency electric power is supplied through a power transformer (Japanese Patent Application No. 2003-056772 (International Application No. PCT/JP 2004/002735, International Laid-open No. WO2004/079813)).

[Patent document 1] Japanese Patent Application No. 2004-055446 (International Application No. PCT/JP 2005/002306)

[Patent document 2] Japanese Patent Application No. 2003-056772 (International Application No. PCT/JP 2004/002735, International Laid-open No. WO2004/079813)

SUMMARY OF THE INVENTION

Hence, it is a main object of the present invention to provide a substrate processing apparatus for plasma-exciting processing gas to process one or more substrates, which can prevent or restrain discharge electrodes for plasma-exciting the processing gas from being deteriorated, and which can increase the lifetime of the discharge electrodes.

According to one aspect of the present invention, there is provided a substrate processing apparatus, comprising:

a processing chamber to accommodate one or more substrates;

a heating section disposed such as to surround the processing chamber from outside;

a gas supply section to supply processing gas into the processing chamber;

a gas discharge section to discharge the processing gas from the processing chamber;

at least a pair of electrodes provided inside the heating section to plasma-excite the processing gas;

a protection container made of dielectric to air-tightly accommodate the electrodes;

an electricity-receiving section which is electrically connected to the electrodes and which is accommodated in the protection container; and an electricity-feeding section to which high frequency electric power is applied and which is provided near the electricity-receiving section in a state in which at least a wall of the protection container is interposed between the electricity-receiving section and the electricity-feeding section, wherein electric power is supplied from the electricity-feeding section to the electricity-receiving section by electromagnetism coupling.

DESCRIPTION OF THE PREFERRED EMBODIMENTS

Next, preferred embodiments of the present invention will be explained.

In the preferred embodiments of the present invention, an apparatus includes a vertical type reaction tube for processing layered substrates, a gas supply system for supplying a plurality of processing gases to the substrates, a buffer chamber which once stores gas to be supplied to the substrates from the gas supply system and equally supplies the gas to the layered substrates, and a pair of capacitive coupling electrodes for producing plasma in the buffer chamber. The electrodes for producing plasma are sealed in electrode protection tubes made of insulator disposed in the buffer chamber. Discharge electric power is supplied to the electrodes sealed in the electrode protection tubes disposed in the buffer chamber by inductive coupling.

Next, the preferred embodiments of the invention will be explained in more detail with reference to the drawings.

First, film forming processing using an ALD (Atomic Layer Deposition) method which was carried out in the embodiments will be explained briefly.

According to the ALD method, raw material gases of two kinds (or more) of gases used for forming a film are alternately supplied onto a substrate one kind by one kind under given film forming conditions (temperature, time and the like), the gases are adsorbed in one atomic unit, and the film is formed utilizing surface reaction.

When a SiN (silicon nitride) film is to be formed for example, in the ALD method, the utilized chemical reaction can form the film of high quality at low a temperature in a range of 300 to 600° C. using DCS ($SiH_2Cl_2$, dichlorsilane) and $NH_3$ (ammonia). The plurality kinds of reaction gases are alternately supplied one kind by one kind. The film thickness is controlled based on the number of supply cycles of reaction gases (for example, if the film forming speed is 1 Å/cycle, the processing is carried out by 20 cycles when a film of 20 Å is to be formed).

First Embodiment

Figure 1:
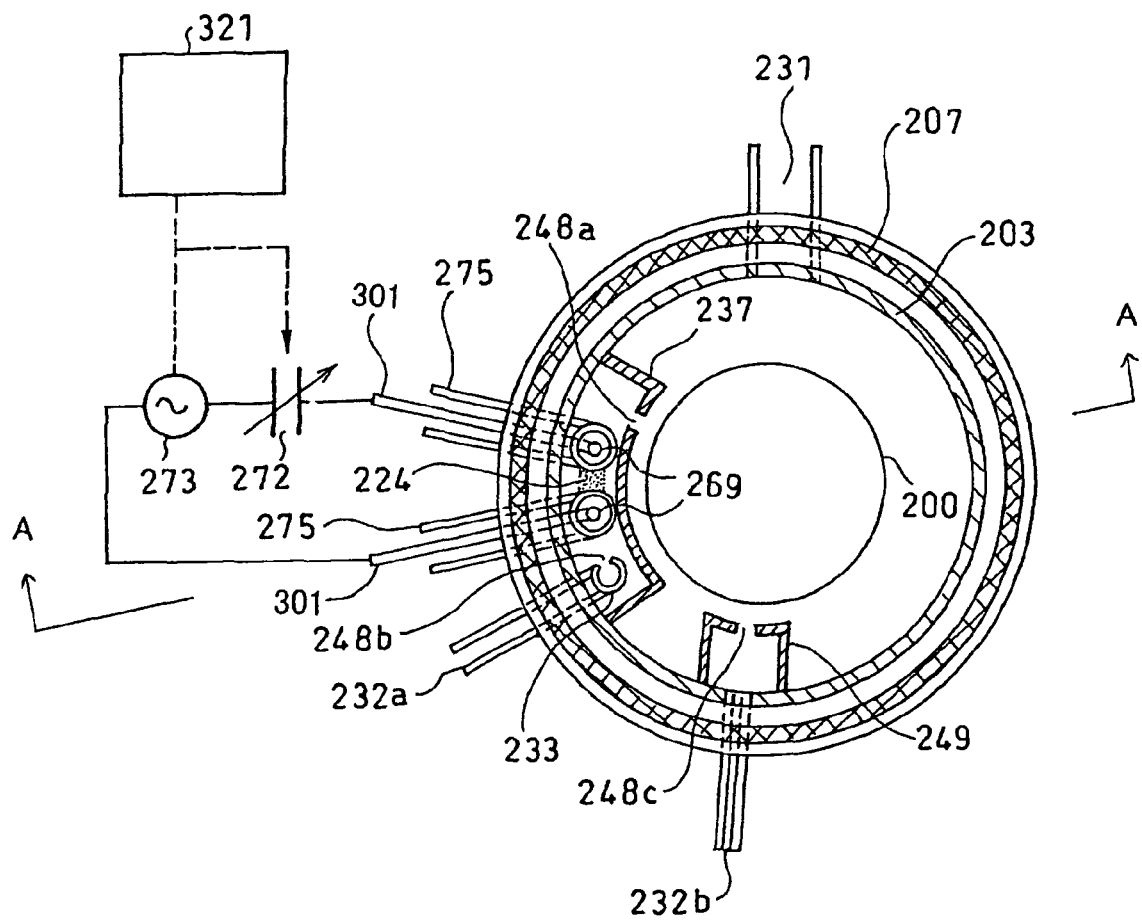
FIG. 1 is a schematic transverse sectional view for explaining a vertical type substrate processing furnace of a conventional substrate processing apparatus.
Figure 2:
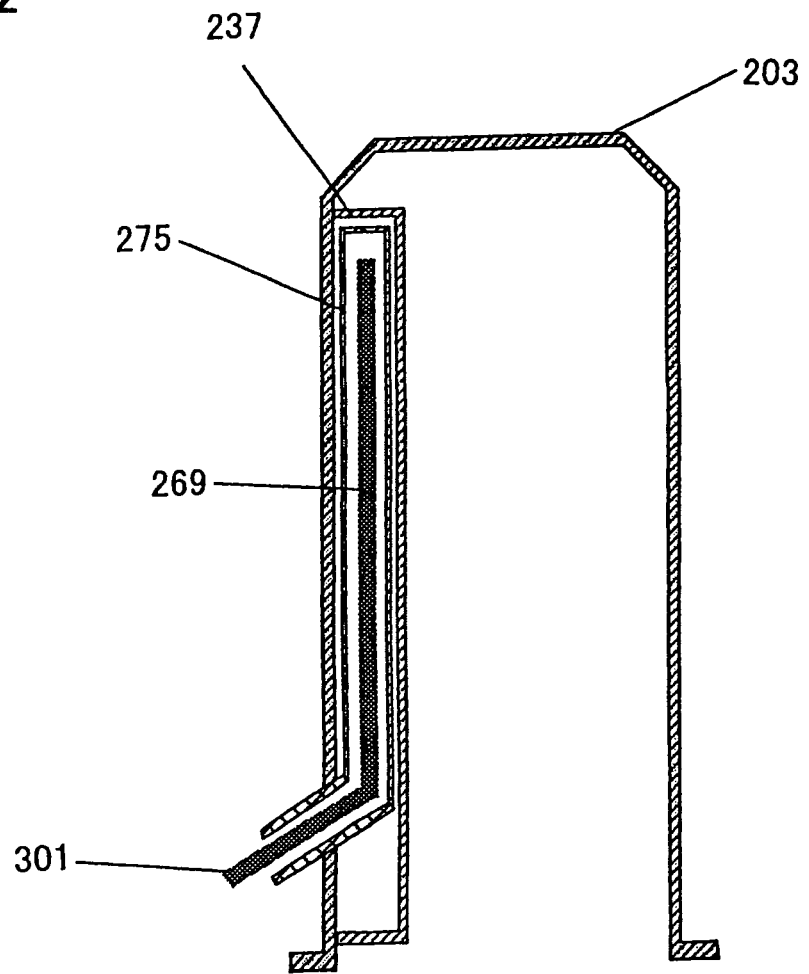
FIG. 2 is a schematic vertical sectional view taken along the line A-A in FIG. 1.
Figure 3:
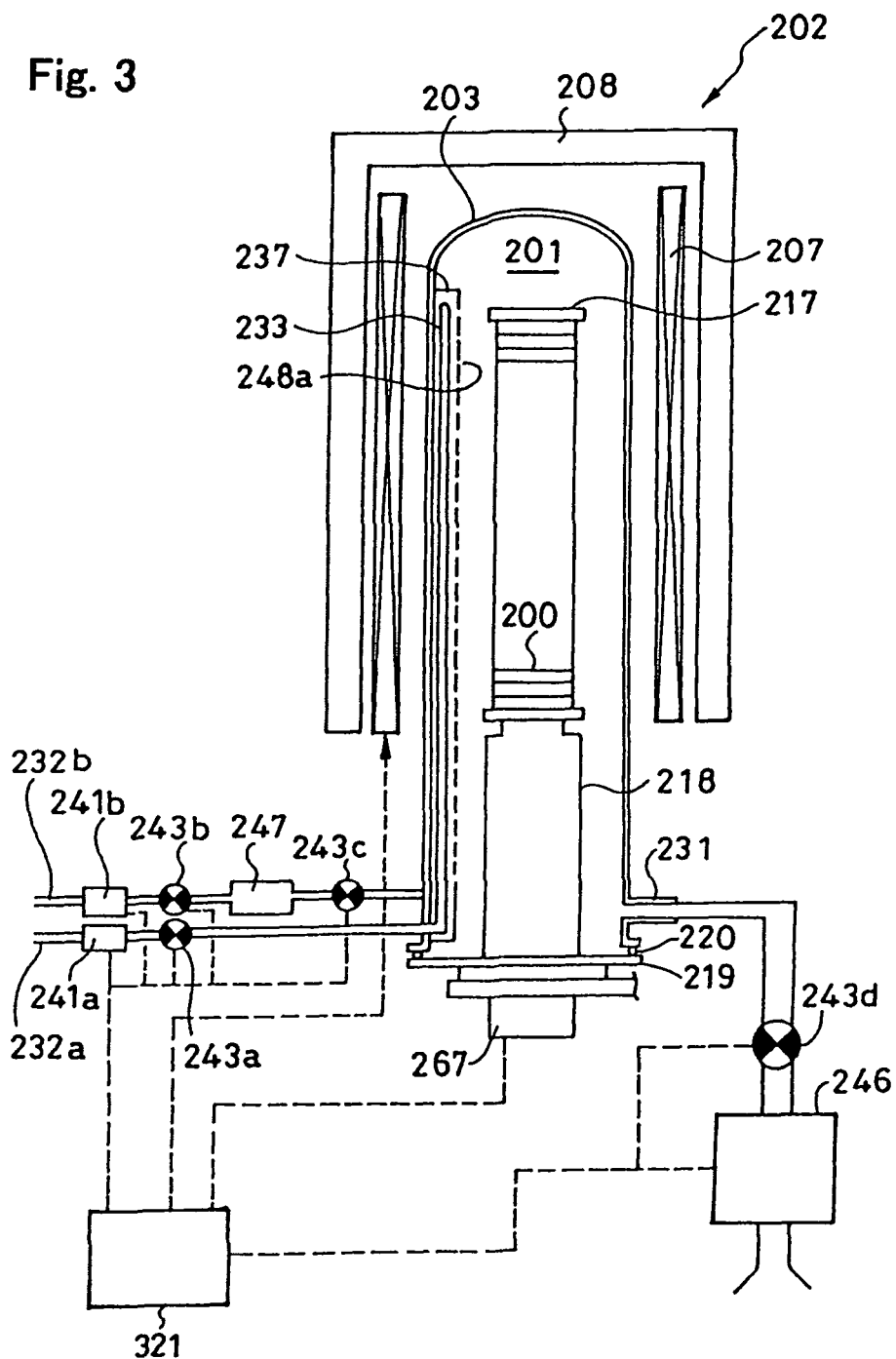
FIG. 3 is a schematic vertical sectional view for explaining a vertical type substrate processing furnace of a substrate processing apparatus according to a preferred first embodiment of the present invention.
Figure 4:
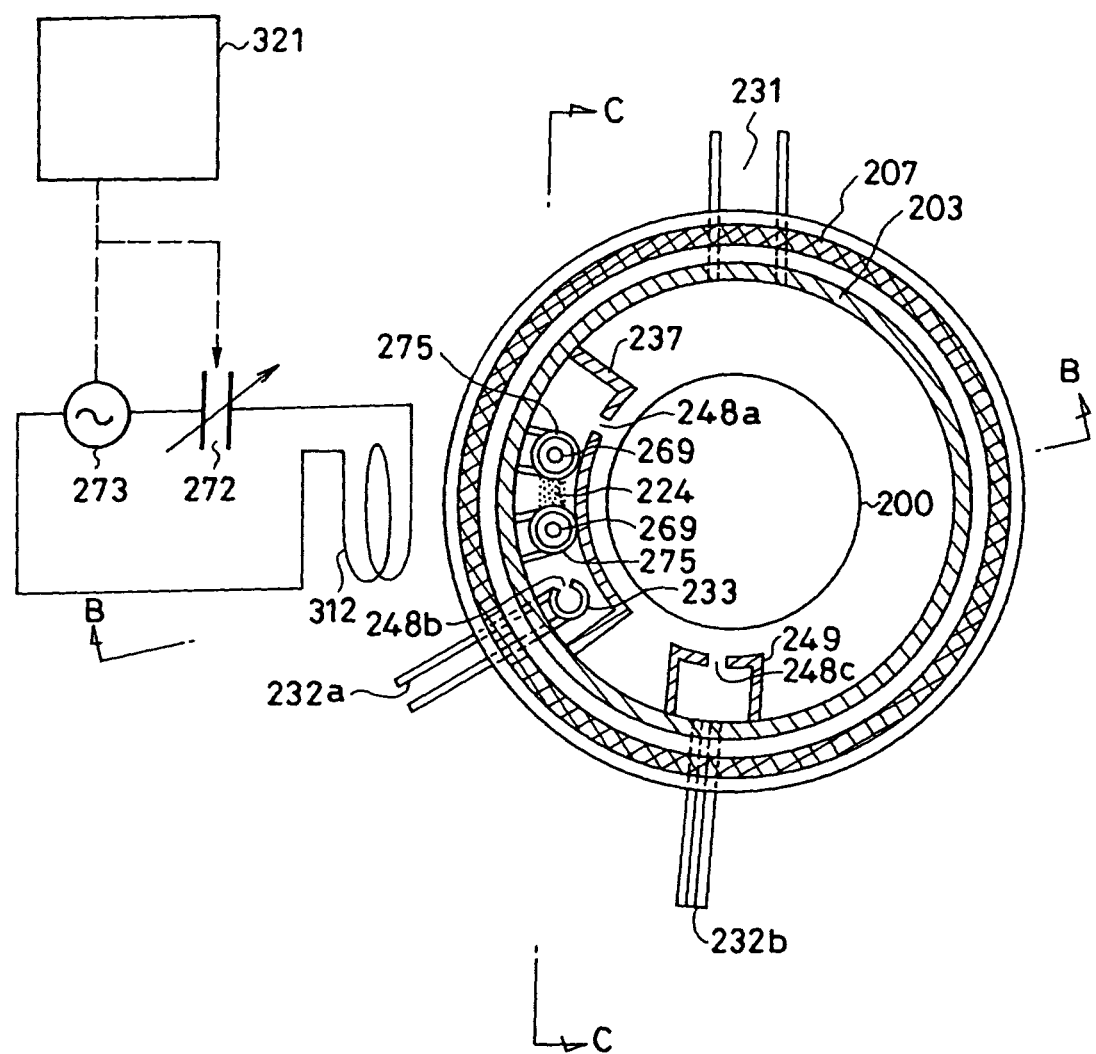
FIG. 4 is a schematic transverse sectional view for explaining a vertical type substrate processing furnace of a substrate processing apparatus according to a preferred first embodiment of the invention.
Figure 5:
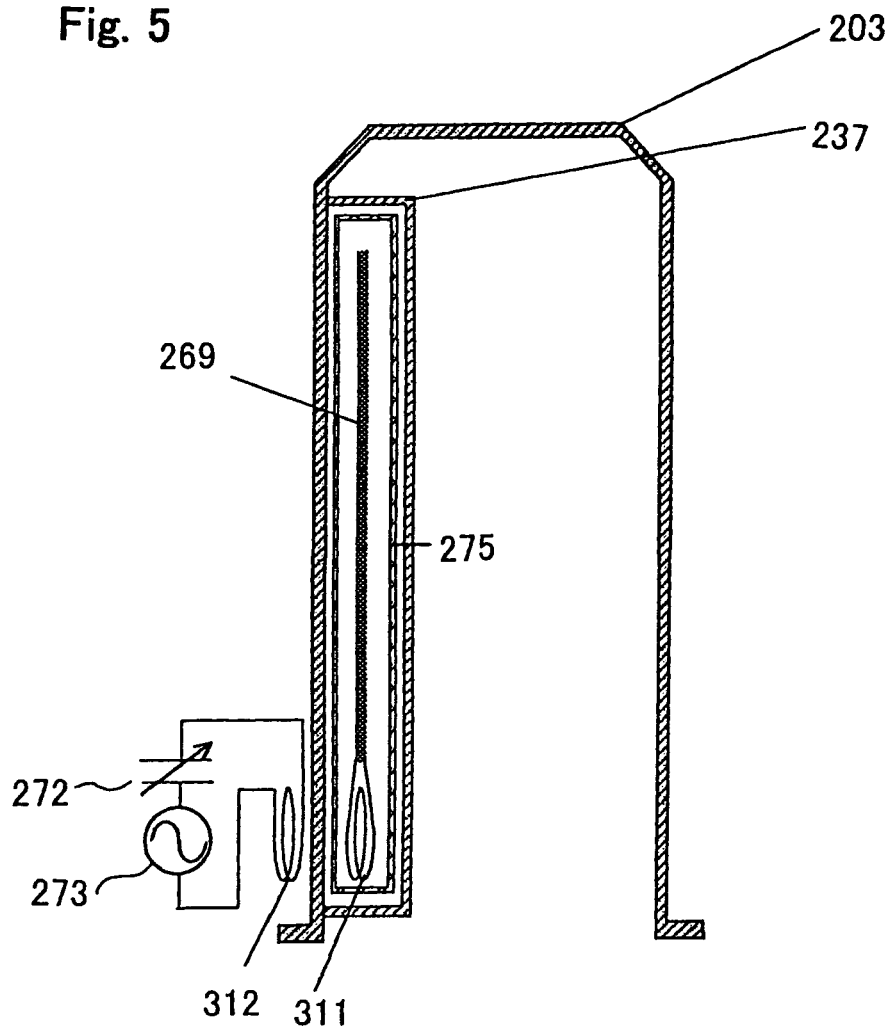
FIG. 5 is a schematic vertical sectional view taken along the line B-B in FIG. 4.
Figure 6:
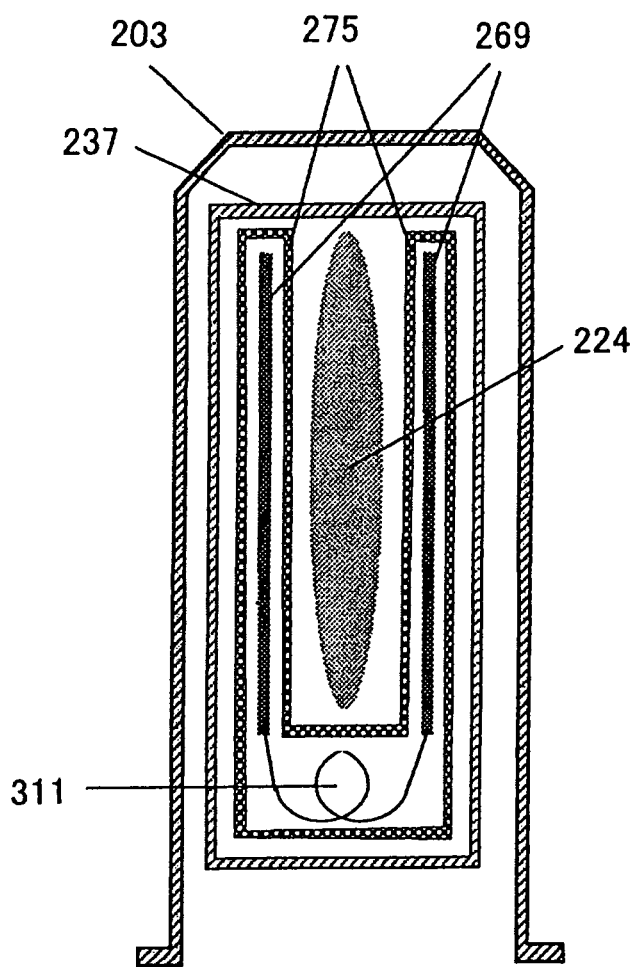
FIG. 6 is a schematic vertical sectional view taken along the line C-C in FIG. 4.

FIG. 3 is a schematic diagram for explaining a structure of a vertical type substrate processing furnace of the present embodiment, and shows a processing furnace portion in vertical cross section. FIG. 4 is a schematic diagram for explaining a structure of the vertical type substrate processing furnace of the present embodiment, and shows the processing furnace portion in transverse cross section. FIG. 5 is a schematic vertical sectional view taken along the line B-B in FIG. 4. FIG. 6 is a schematic vertical sectional view taken along the line C-C in FIG. 4.

A quartz reaction tube 203 as a reaction container is provided inside a heater 207 which is heating means. The reaction tube 203 processes wafers 200 as substrates. A lower end opening of the reaction tube 203 is air-tightly closed by a seal cap 219 which is a lid through an O-ring 220 as an airtight member. A thermal insulation member 208 is provided outside the reaction tube 203 and the heater 207. The thermal insulation member 208 covers an upper end of the heater 207. At least the heater 207, the thermal insulation member 208, the reaction tube 203 and the seal cap 219 form a processing furnace 202. The reaction tube 203, the seal cap 219 and a later-described buffer chamber 237 formed in the reaction tube 203 form a processing chamber 201. A boat 217 which is substrate-holding means stands on the seal cap 219 through a quartz cap 218. The quartz cap 218 functions as a holding body which holds the boat 217. The boat 217 is inserted into the processing furnace 202. A plurality of wafers 200 to be batch processed are stacked on the boat 217 in the vertical direction in many layers in an axial direction of the tube in their horizontal attitudes. The heater 207 heats the wafers 200 inserted into the processing furnace 202 to a predetermined temperature.

The processing furnace 202 is provided with two gas supply tubes 232a and 232b as supply tubes for supplying a plurality kinds (two kinds, in this embodiment) of gases to the processing furnace 202. A reaction gas is supplied from a gas supply tube 232a to the processing chamber 201 through a mass flow controller 241a which is a flow rate control means, and a valve 243a which is an open/close valve, and the buffer chamber 237 formed in the reaction tube 203. Further, another reaction gas is supplied to the processing chamber 201 from a gas supply tube 232b through a mass flow controller 241b which is a flow rate control means, a valve 243b which is an open/close valve, a gas reservoir 247, a valve 243c which is an open/close valve, and a later-described gas supply section 249.

Tube heaters (not shown) are mounted on the two gas supply tubes 232a and 232b, which are capable of heating the gas supply tubes to about 120° C., for preventing $NH_4Cl$, which is a reaction by-product, from adhering to the tubes.

The processing chamber 201 is connected to a vacuum pump 246 which is exhausting means through a valve 243d by a gas exhaust tube 231 which is an exhaust tube through which gas is exhausted so that the processing chamber 201 is evacuated. The valve 243d is an open/close valve, and the processing chamber 201 can be evacuated and the evacuation can be stopped by opening and closing the valve 243d. If the opening of the valve is adjusted, the pressure in the processing chamber 201 can be adjusted.

The buffer chamber 237 which is a gas dispersing space is provided in an arc space between the reaction tube 203 constituting the processing chamber 201 and the wafers 200. The buffer chamber 237 is provided along the stacking direction of the wafers 200 and along an inner wall of the reaction tube 203 from a lower portion to a higher portion of the reaction tube 203. Gas supply holes 248a which are supply holes through which gas is supplied are formed in an inner wall of the buffer chamber 237 near an end portion of the inner wall adjacent to the wafers 200. The gas supply holes 248a are opened toward the center of the reaction tube 203. The gas supply holes 248a have the same opening areas over a predetermined length from a lower portion to an upper portion along the stacking direction of the wafers 200, and pitches between the gas supply holes 248a are equal to each other.

A nozzle 233 is disposed near another end of the buffer chamber 237 on the opposite side from the end of the buffer chamber 237 where the gas supply holes 248a are provided. The nozzle 233 is disposed along the stacking direction of the wafers 200 from the lower portion to the upper portion of the reaction tube 203. The nozzle 233 is provided with a plurality of gas supply holes 248b which are supply holes through which gas is supplied. The plurality of gas supply holes 248b are disposed along the stacking direction of the wafers 200 over the same predetermined length as that of the gas supply holes 248a. The plurality of gas supply holes 248b and the plurality of gas supply holes 248a are disposed at corresponding locations, respectively.

When a pressure difference between the buffer chamber 237 and the processing furnace 202 is small, it is preferable that the opening areas of the gas supply holes 248b are equal to each other from an upstream side to a downstream side and opening pitches are the same, but when the pressure difference is large, it is preferable that the opening area is increased or the opening pitches are reduced from the upstream side toward the downstream side.

By adjusting the opening areas or opening pitches of the gas supply holes 248b from the upstream side to the downstream side, gas is ejected with a substantially uniform flow rate although the velocities of flows of the gas through the respective gas supply holes 248b are different from each other. The gas ejected from the gas supply holes 248b is ejected into the buffer chamber 237. The gas is once introduced into the buffer chamber 237, which makes it possible to equalize the velocities of flows of gases.

That is, in the buffer chamber 237, the particle velocity of the gas ejected from each gas supply hole 248b is moderated in the buffer chamber 237 and then, the gas is ejected into the processing chamber 201 from the gas supply hole 248a. During that time, the gas ejected from each gas supply hole 248b becomes gas having an equal flow rate and a equal velocity of flow when the gas is ejected from the gas supply hole 248a.

A pair of thin and long rod-like discharge electrodes 269 are disposed in the buffer chamber 237 from the upper portion to the lower portion of the buffer chamber 237. Lower ends of the two discharge electrodes 269 are connected to a coupling coil 311 at a lower portion of the reaction tube 203. The discharge electrodes 269 and the coupling coil 311 are airtightly sealed and covered with the electrode protection tubes 275 made of dielectric. Inert gas is charged into the electrode protection tubes 275, and the inert gas is sealed in the electrode protection tubes 275.

An induction coil 312 connected to the high frequency power supply 273 through the matching device 272 is disposed outside the reaction tube 203, and the induction coil 312 is inductive-coupled to the coupling coil 311. High frequency electric power from the high frequency power supply 273 is transferred to the discharge electrodes 269 through the induction coil 312 and the coupling coil 311 to generate plasma 224 at an opposed portion of the discharge electrodes 269.

The discharge electrodes 269 are sealed in the electrode protection tubes 275 in which inert gas is sealed. This prevents oxygen from being mixed from outside, and deterioration of the electrodes by oxidation can be prevented or restrained. Electric connection to the discharge electrodes 269 is eliminated. Therefore, it is possible to prevent the discharge electrodes from being damaged at the time of maintenance of the reaction tube.

A gas supply section 249 is formed on an inner wall separated from the position of the gas supply holes 248a by about 120° along an inner periphery of the reaction tube 203. The gas supply section 249 is a supply section which shares the gas supply species with the buffer chamber 237 when the plurality kinds of gases are alternately supplied to the wafers 200 one kind by one kind when films are formed by the ALD method.

Like the buffer chamber 237, the gas supply section 249 also has gas supply holes 248c which are supply holes through which gas is supplied to positions adjacent to the wafers at the same pitch, and the gas supply section 249 is connected to a gas supply tube 232b at a lower portion thereof.

When a pressure difference between the buffer chamber 237 and the processing chamber 201 is small, it is preferable that the opening areas of the gas supply holes 248c are equal to each other from the upstream side to the downstream side and the opening pitches are the same, but when the pressure difference is large, it is preferable that the opening area is increased or the opening pitches are reduced from the upstream side toward the downstream side.

The boat 217 is provided at a central portion in the reaction tube 203, and the plurality of wafers 200 are placed in many layers at equal distances from one another in the vertical direction. The boat 217 can be brought into and out from the reaction tube 203 by a boat elevator mechanism (not shown). To enhance the uniformity of the processing, a boat rotating mechanism 267 which is a rotating means for rotating the boat 217 is provided. By rotating the boat rotating mechanism 267, the boat 217 held by the quartz cap 218 is rotated.

A controller 321 which is a control means is connected to the mass flow controllers 241a and 241b, the valves 243a, 243b, 243c and 243d, the heater 207, the vacuum pump 246, the boat rotating mechanism 267, the boat elevator 121, the high frequency power supply 273 and the matching device 272. The controller 321 adjusts flow rates of the mass flow controllers 241a and 241b, opens and closes valves 243a, 243b and 243c, opens and closes the valve 243d, performs a pressure adjustment operation of the valve 243d, opens and closes a regulator 302, adjusts a pressure of the regulator 302, adjusts the temperature of the heater 207, actuates and stops the vacuum pump 246, adjusts rotation of the boat rotating mechanism 267, controls a vertical motion of the boat elevator 121, controls supply of electric power of the high frequency power supply 273, and controls impedance by the matching device 272.

Next, an example of the film forming operation by the ALD method will be explained based on a case wherein SiN films are formed using DCS gas and $NH_3$ gas.

First, wafers 200 on which films are to be formed are mounted on the boat 217, and the boat 217 is brought into the processing furnace 202. Then, the following three steps are carried out in sequence.

[Step 1]

In step 1, $NH_3$ gas which is required to be plasma-excited, and DCS gas which is not required to be plasma-excited are fed together. First, the valve 243a provided in the gas supply tube 232a and the valve 243d provided in the gas exhaust tube 231 are both opened, $NH_3$ gas whose flow rate is adjusted by the mass flow controller 243a is sent from the gas supply tube 232a and ejected into the buffer chamber 237 from the gas supply holes 248b of the nozzle 233, high frequency electric power is applied between the discharge electrodes 269 from the high frequency power supply 273 through the matching device 272, the induction coil 312 and the coupling coil 311, and the gas is supplied to the processing chamber 201 as active species and in this state, gas is exhausted from the gas exhaust tube 231. When flowing the $NH_3$ gas by plasma-exciting the $NH_3$ gas, the valve 243d is appropriately adjusted, and a pressure in the processing chamber 201 is adjusted to 10 to 100 Pa. A supply flow rate of $NH_3$ controlled by the mass flow controller 241a is in a range of 1,000 to 10,000 sccm. Time during which the wafers 200 are exposed to active species obtained by plasma-exciting $NH_3$ is in a range of 2 to 120 seconds. The temperature of the heater 207 at that time is set such that the temperature of the wafer becomes 500 to 600° C. Since the reaction temperature of $NH_3$ is high, the $NH_3$ does not react at the temperature of the wafer. Therefore, $NH_3$ is fed as active species by plasma-exciting the same, which makes it possible to feed the $NH_3$ while keeping the wafers at the set low temperature range.

When $NH_3$ is plasma-excited and fed as active species, the valve 243b located upstream of the gas supply tube 232b is opened and the valve 243c located downstream is closed so that DCS flows also. With this, DCS is stored in the gas reservoir 247 provided between the valves 243b and 243c. Gas flowing into the processing chamber 201 is the active species obtained by plasma-exciting the $NH_3$, and DCS does not exist. Therefore, $NH_3$ does not generate a vapor-phase reaction, and the $NH_3$ which becomes the active species by plasma excitation surface-reacts with a foundation film on the wafer 200.

[Step 2]

In step 2, the valve 243a of the gas supply tube 232a is closed to stop the supply of $NH_3$, but the supply to the gas reservoir 247 is continued. If a predetermined amount of DCS having a predetermined pressure is stored in the gas reservoir 247, the upstream valve 243b is also closed, and DCS is confined in the gas reservoir 247. The valve 243d of the gas exhaust tube 231 is held opened, the processing chamber 201 is evacuated by the vacuum pump 246 to 20 Pa or lower, and remaining $NH_3$ is exhausted from the processing chamber 201. At that time, if inert gas such as $N_2$ is supplied to the processing chamber 201, the effect for exhausting the residual $NH_3$ is further enhanced. The DCS is stored in the gas reservoir 247 such that the pressure therein becomes 20,000 Pa or higher. Further, the apparatus is constituted such that the conductance between the gas reservoir 247 and the processing chamber 201 becomes $1.5 \times 10^{-3}$ m$^3$/s or higher. If a ratio between a capacity of the reaction tube 203 and a capacity of the gas reservoir 247 is considered, when the capacity of the reaction tube 203 is 1.00 l (100 liters), it is preferable that the capacity of the gas reservoir 247 is in a range of 100 to 300 cc, and it is preferable that as the capacity ratio, the capacity of the gas reservoir 247 is $1/1,000$ to $3/1,000$ times of the capacity of the reaction chamber.

[Step 3]

If the exhausting operation of the processing chamber 201 is completed, the valve 243c of the gas exhaust tube 231 is closed to stop the exhausting operation. The valve 243c located downstream of the gas supply tube 232b is opened. With this, DCS stored in the gas reservoir 247 is supplied to the processing chamber 201 at a dash. At that time, since the valve 243d of the gas exhaust tube 231 is closed, the pressure in the processing chamber 201 is increased abruptly to about 931 Pa (7 Torr). Time during which DCS was supplied is set to two to four seconds, and time during which the wafers are exposed to the increased pressure atmosphere is set to two to four seconds, and total time is set to six seconds. The temperature of the wafers at that time is the same as the temperature when $NH_3$ is supplied, i.e., 500 to 600° C. By supplying the DCS, the $NH_3$ and the DCS on the foundation film surface-react with each other, and SiN films are formed on the wafers 200. After the films are formed, the valve 243c is closed and the valve 243d is opened, and the processing chamber 201 is evacuated, and residual DCS gas which contributed to the formation of films is exhausted. At that time, if inert gas such as $N_2$ is supplied to the processing chamber 201, the effect for exhausting the residual DCS gas after it contributed to the formation of films from the processing chamber 201 is enhanced. The valve 243b is opened and supply of DCS into the gas reservoir 247 is started.

The above steps 1 to 3 are defined as one cycle, and this cycle is repeated a plurality of times, and SiN films each having a predetermined thickness are formed on the wafers.

In the ALD apparatus, gas is adsorbed on a foundation film surface. The adsorption amount of gas is proportional to pressure of gas and exposure time of gas. Therefore, in order to adsorb a desired amount of gas for a short time, it is necessary to increase the pressure of gas for a short time. In the embodiment, since DCS stored in the gas reservoir 247 is momentarily supplied in a state where the valve 243d is closed, the pressure of DCS in the processing chamber 201 can be increased abruptly, and a desired amount of gas can be adsorbed momentarily.

In the embodiment, $NH_3$ gas is plasma-excited and supplied as active species and the processing chamber 201 is evacuated while DCS is stored in the gas reservoir 247. Such operations are necessary steps in the ALD method. Therefore, a special step for storing the DCS is not required. Further, the processing chamber 201 is evacuated and $NH_3$ gas is removed and then, DCS flows. Therefore, these gases do not react when they are sent toward the wafers 200. The supplied DCS can effectively react only with $NH_3$ which is adsorbed on the wafers 200.

Figure 7:
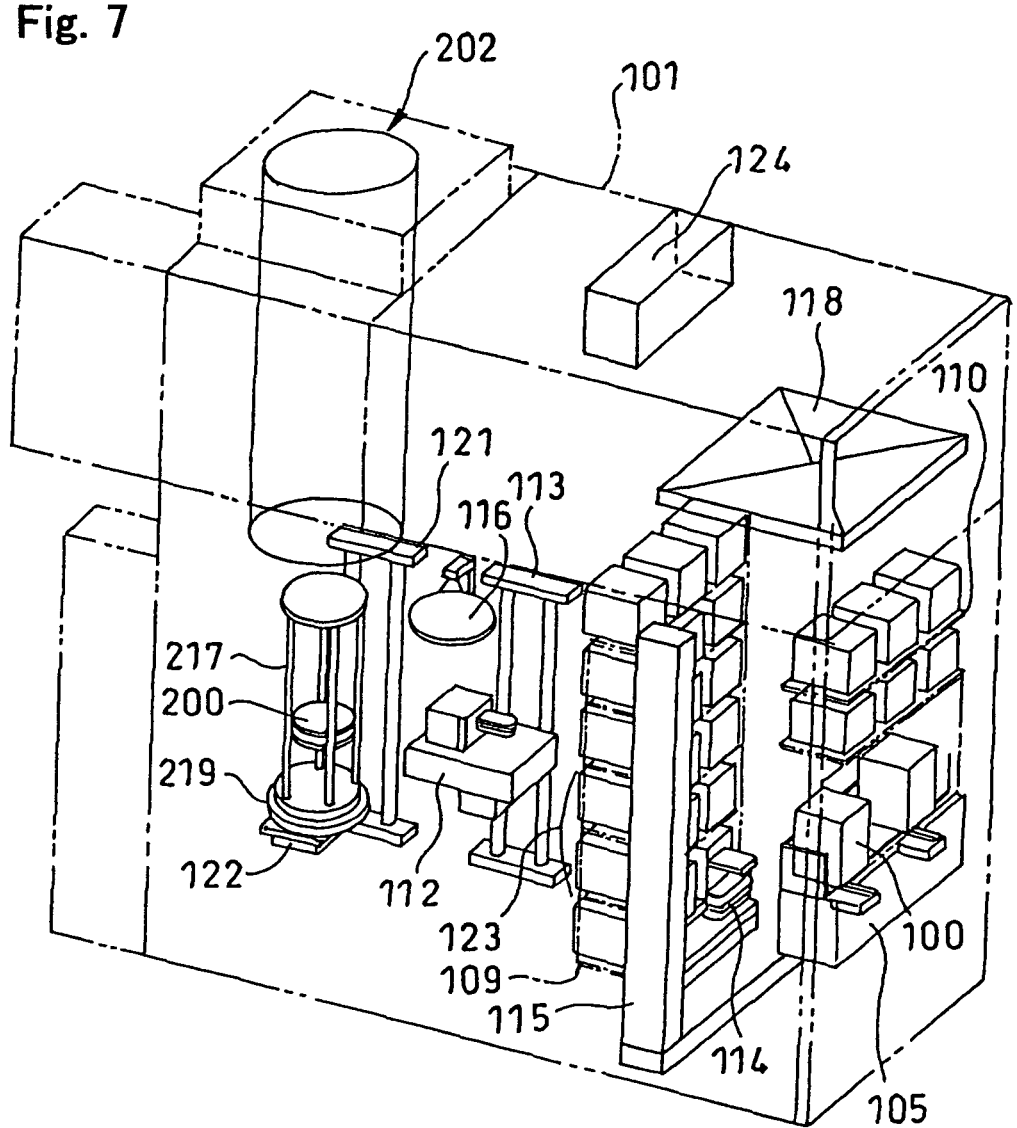
FIG. 7 is a schematic perspective view for explaining the substrate processing apparatuses according to preferred first to fifth embodiments of the present invention.
Figure 8:
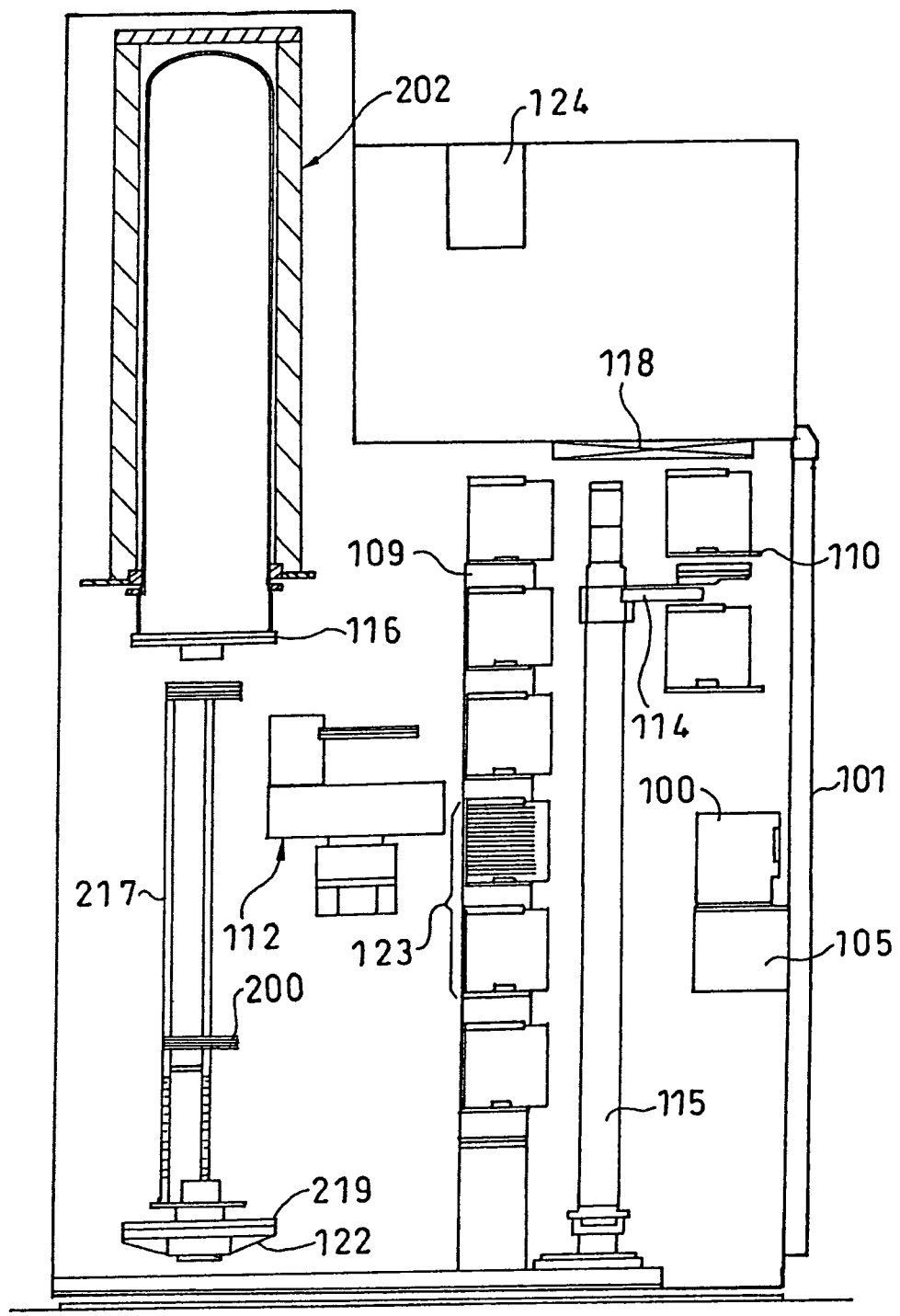
FIG. 8 is a schematic vertical sectional view for explaining the substrate processing apparatuses according to the preferred first to fifth embodiments of the present invention.

Next, an outline of the substrate processing apparatus of the embodiment will be explained with reference to FIGS. 7 and 8.

A cassette stage 105 as a holder delivery member which delivers cassettes 100 as substrate accommodating containers to and from an external transfer device (not shown) is provided on a front side in a case 101. A cassette elevator 115 as elevator means is provided behind the cassette stage 105. A cassette transfer device 114 as transfer means is mounted on the cassette elevator 115. Cassette shelves 109 as mounting means of the cassettes 100 are provided behind the cassette elevator 115. Auxiliary cassette shelves 110 are also provided above the cassette stage 105. A clean unit 118 is provided above the auxiliary cassette shelves 110 and clean air flows through the case 101.

The processing furnace 202 is provided on the rear side and at an upper portion in the case 101. The boat elevator 121 as elevator means is provided below the processing furnace 202. The boat elevator 121 vertically brings the boat 217 as the substrate holding means into and from the processing furnace 202. The boat 217 holds the wafers 200 as substrates in many layers in their horizontal attitudes. The seal cap 219 as a lid is mounted on a tip end of the elevator member 122 which is mounted on the boat elevator 121, and the seal cap 219 vertically supports the boat 217. A transfer elevator 113 as elevator means is provided between the boat elevator 121 and the cassette shelf 109, and a wafer transfer device 112 as transfer means is mounted on the transfer elevator 113. A furnace opening shutter 116 as closing means which air-tightly closes a lower side of the processing furnace 202 is provided beside the boat elevator 121. The furnace opening shutter 116 has an opening/closing mechanism.

The cassette 100 in which wafers 200 are loaded is transferred onto the cassette stage 105 from an external transfer device (not shown) in such an attitude that the wafers 200 are oriented upward, and the cassette 100 is rotated by the cassette stage 105 by 90° such that the wafers 200 are oriented horizontally. The cassette 100 is transferred from the cassette stage 105 onto the cassette shelf 109 or the auxiliary cassette shelf 110 by a combination of vertical and lateral motions of the cassette elevator 115, and advancing and retreating motions and a rotation motion of the cassette transfer device 114.

Some of the cassette shelves 109 are transfer shelves 123 in which cassettes 100 to be transferred by the wafer transfer device 112 are accommodated. Cassettes 100 to which the wafers 200 are transferred are transferred to the transfer shelf 123 by the cassette elevator 115 and the cassette transfer device 114.

If the cassette 100 is transferred to the transfer shelf 123, the transfer shelf 123 transfers the wafers 200 to the lowered boat 217 by a combination of advancing and retreating motions and a rotation motion of the wafer transfer device 112, and a vertical motion of the transfer elevator 113.

If a predetermined number of wafers 200 are transferred to the boat 217, the boat 217 is inserted into the processing furnace 202 by the boat elevator 121, and the seal cap 219 air-tightly closes the processing furnace 202. The wafers 200 are heated in the air-tightly closed processing furnace 202, processing gas is supplied into the processing furnace 202, and the wafers 200 are processed.

If the processing of the wafers 200 is completed, the wafers 200 are transferred to the cassette 100 of the transfer shelf 123 from the boat 217, the cassette 100 is transferred to the cassette stage 105 from the transfer shelf 123 by the cassette transfer device 114, and is transferred out from the case 101 by the external transfer device (not shown) through the reversed procedure. When the boat 217 is in its lowered state, the furnace opening shutter 116 air-tightly closes the lower surface of the processing furnace 202 to prevent outside air from being drawn into the processing furnace 202.

The transfer motions of the cassette transfer device 114 and the like are controlled by transfer control means 124.

Second Embodiment

Figure 9:
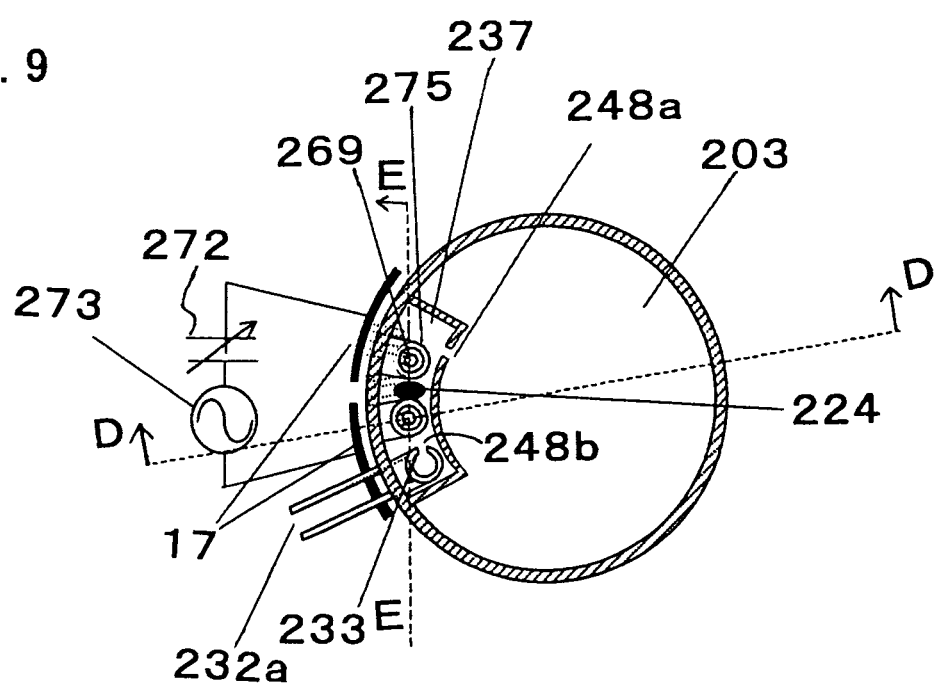
FIG. 9 is a schematic transverse sectional view for explaining a vertical type substrate processing furnace of a substrate processing apparatus according to the preferred second embodiment of the present invention.
Figure 10:
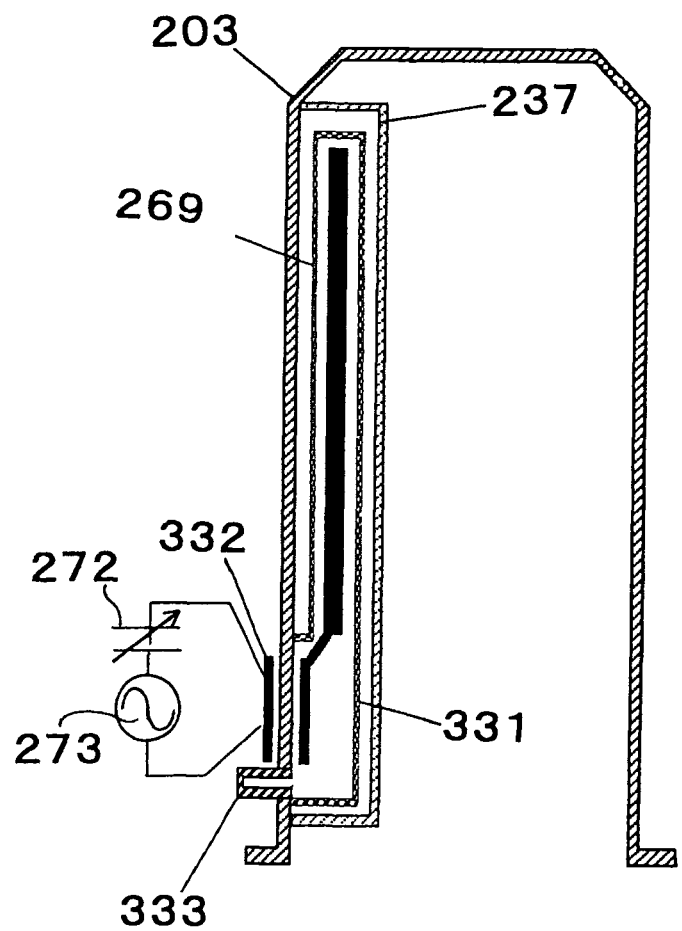
FIG. 10 is a schematic vertical sectional view taken along the line D-D in FIG. 9.
Figure 11:
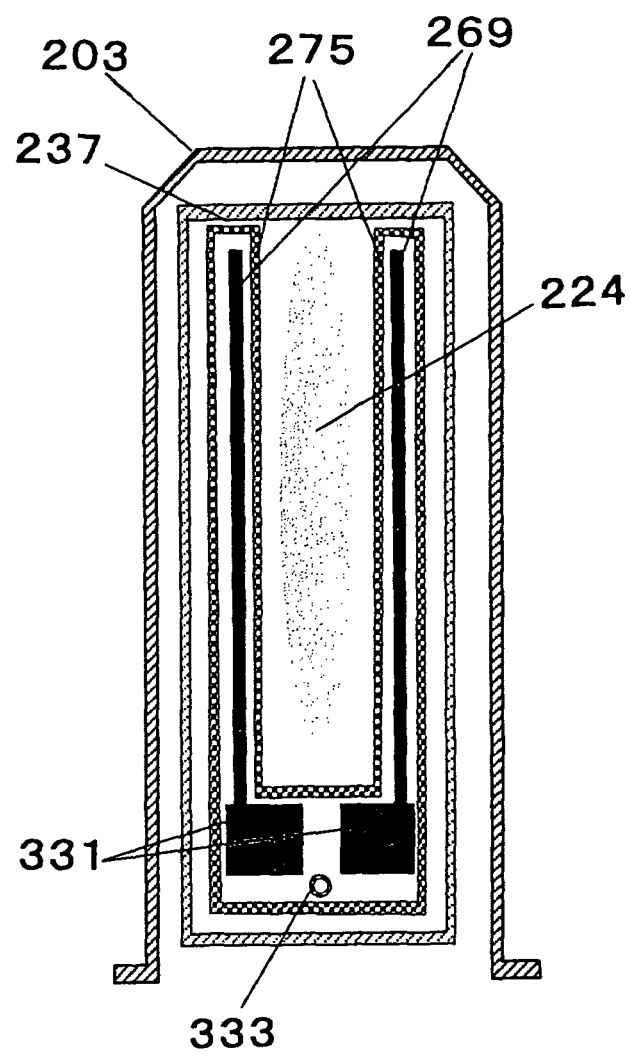
FIG. 11 is a schematic vertical sectional view taken along the line E-E in FIG. 9.

Referring to FIGS. 9 to 11, two discharge electrodes 269 are connected to electrostatic coupled plates 331 at a lower portion of the reaction tube 203. The discharge electrodes 269 and the electrostatic coupled plates 331 are covered with a dielectric tube (electrode protection tube) 275 and an inner wall of the reaction tube 203, and the dielectric tube 275 is filled with inert gas. Electric power supply plates 332 connected to a transmitter (high frequency power supply) 273 is disposed outside the reaction tube 203. The electric power supply plates 332 are disposed at a position where the electric power supply plates 332 are electrostatically coupled to the electrostatic coupled plates 331. The high frequency electric power of the transmitter 273 is transferred to the discharge electrodes 269 through the electric power supply plates 332 and the electrostatic coupled plates 331, and plasma 224 is generated at the opposed portions of the discharge electrodes.

If each of the electric power supply plates and the electrostatic coupled plates has an area of 10,000 mm$^2$ (10 cm×10 cm) and a quartz glass having a thickness of 5 mm is sandwiched between the plates, the capacity becomes about 70 PF, which allows high frequency current to be transferred sufficiently. Current is slightly varied depending upon the shape of the discharge electrodes, though. At that time, it is necessary for the dielectric protection tubes 276, in which the electrodes are disposed, to be filled with inert gas having a sufficient pressure. If the pressure is insufficient, there is a possibility that electric discharge is generated in the dielectric protection tube. Although there is no problem if the pressure is 100 Torr or higher, it is preferable that the pressure is equal to the atmospheric pressure (760 Torr) or higher.

The inert gas is filled in the following manner. That is, an inert gas charging port 23 is provided when the reaction tube is produced, and after the reaction tube is completed, gas in the dielectric protection tube is purged and then, the inert gas having a predetermined pressure is filled, and the sealing port 23 is sealed.

Third Embodiment

Figure 12:
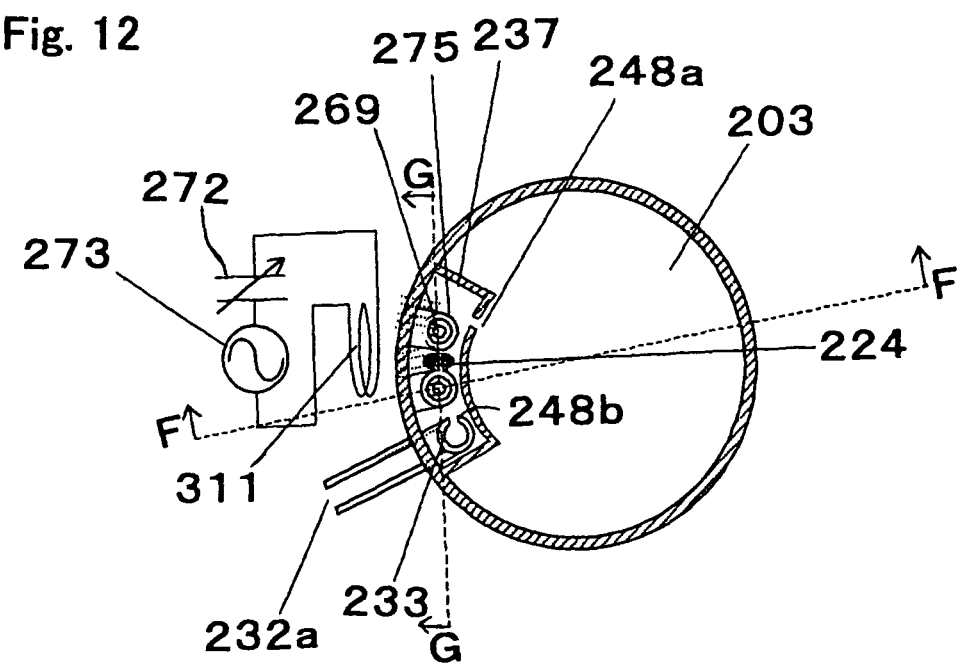
FIG. 12 is a schematic transverse sectional view for explaining a vertical type substrate processing furnace of a substrate processing apparatus according to the preferred third embodiment of the present invention.
Figure 13:
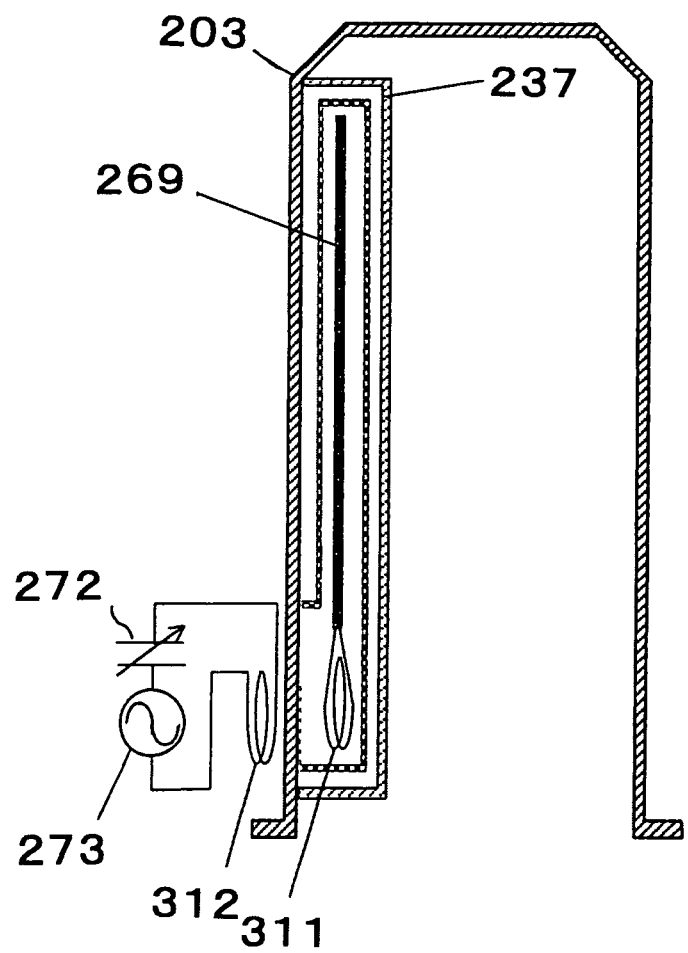
FIG. 13 is a schematic vertical sectional view taken along the line F-F in FIG. 12.
Figure 14:
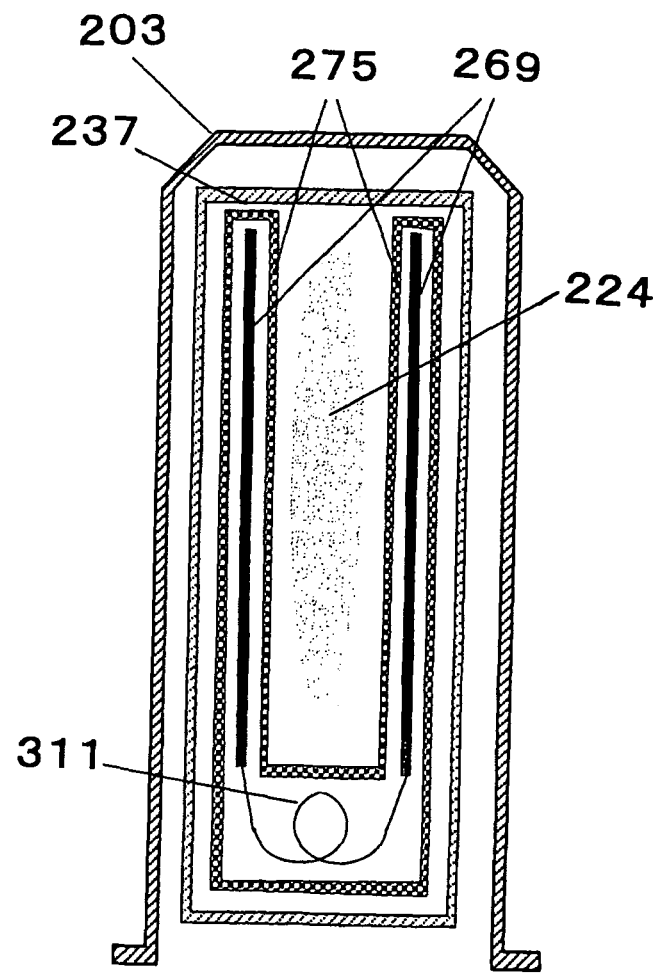
FIG. 14 is a schematic vertical sectional view taken along the line G-G in FIG. 12.

Referring to FIGS. 12 to 14, the two discharge electrodes 269 are connected to the coupling coil 311 at a lower portion of the reaction tube 203. The discharge electrodes 269 and the coupling coil 311 are covered with the dielectric tube 275 and an inner wall of the reaction tube 203, and the dielectric tube 275 is filled with inert gas. The induction coil 312 connected to the transmitter 273 is disposed outside the reaction tube 203, and is inductive coupled to the coupling coil 311. High frequency electric power of the transmitter 273 is transferred to the discharge electrode 269 through the induction coil 312 and the coupling coil 311, and plasma 224 is generated at the opposed portions of the discharge electrodes. When circular coils of ϕ60 were used as the induction coil and the coupling coil, and a quartz glass having a thickness of 5 mm was sandwiched between the coils, discharge could be generated between the discharge electrodes with high frequency electric power of 300 W in nitrogen gas atmosphere of 1 Torr.

Fourth Embodiment

Figure 15:
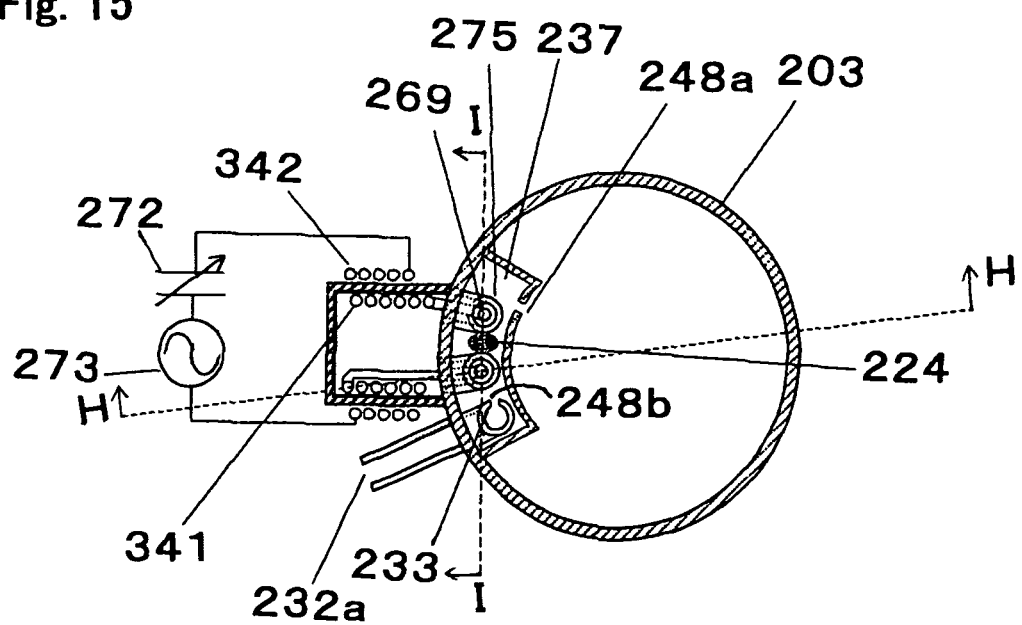
FIG. 15 is a schematic transverse sectional view for explaining a vertical type substrate processing furnace of a substrate processing apparatus according to the preferred fourth embodiment of the invention.
Figure 16:
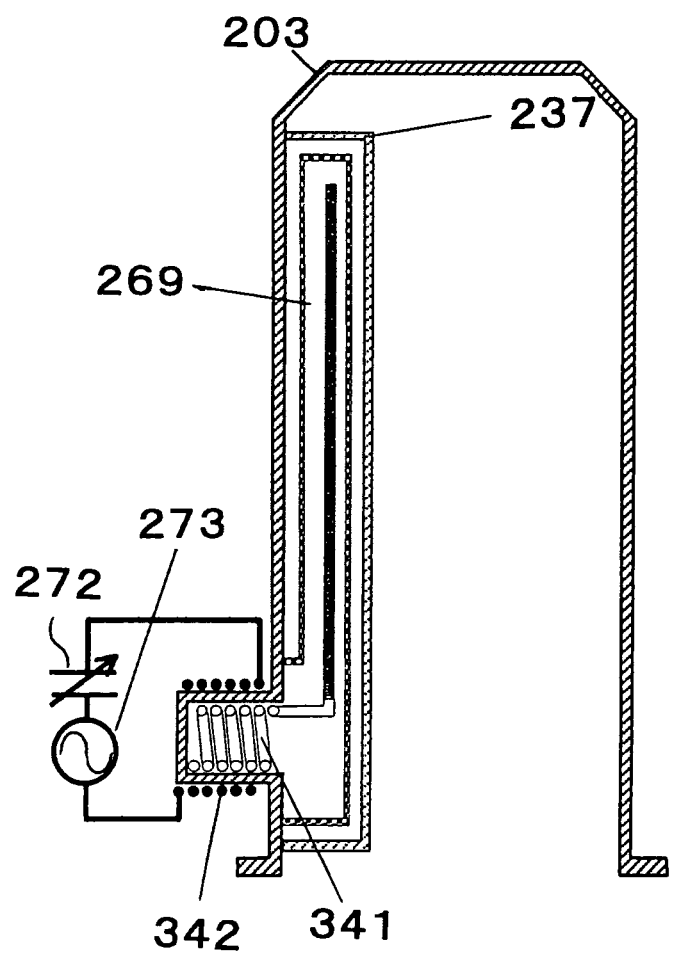
FIG. 16 is a schematic vertical sectional view taken along the line H-H in FIG. 15.
Figure 17:
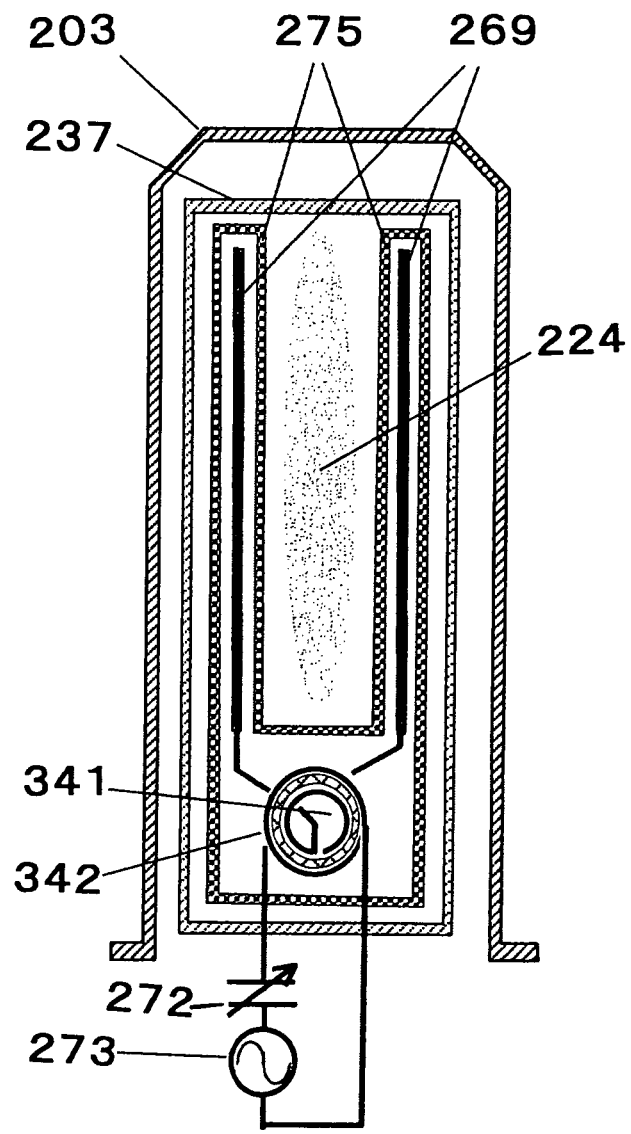
FIG. 17 is a schematic vertical sectional view taken along the line I-I in FIG. 15.

As a method for enhancing the transfer efficiency of high frequency electric power, there is a method in which solenoid coils are disposed concentrically so as to couple the induction coil 342 and the coupling coil 341 more densely (see FIGS. 15 to 17).

Fifth Embodiment

Figure 18:
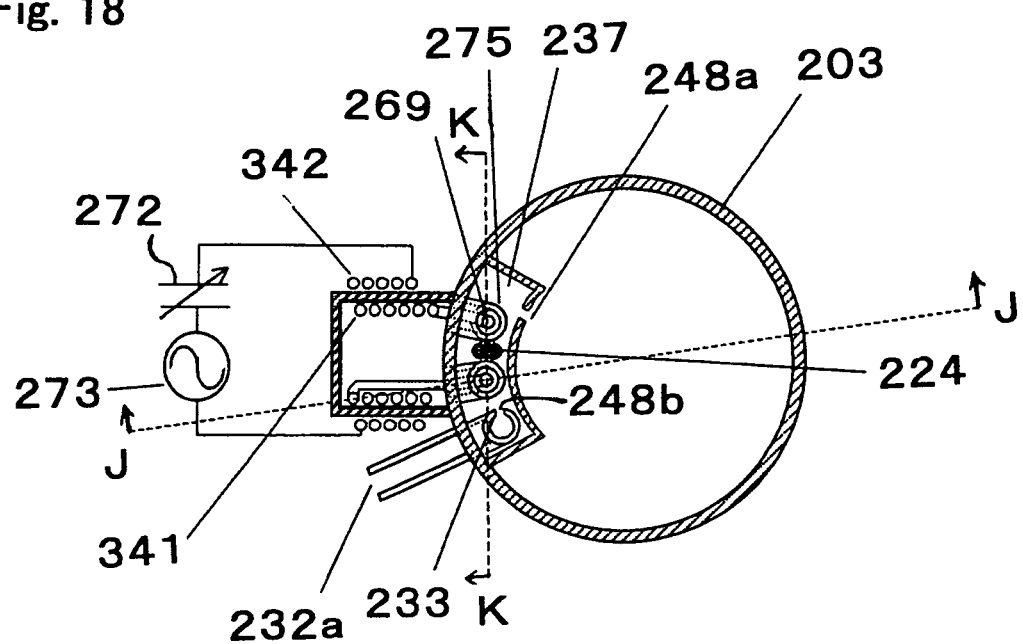
FIG. 18 is a schematic transverse sectional view for explaining a vertical type substrate processing furnace of a substrate processing apparatus according to the preferred fifth embodiment of the present invention.
Figure 19:
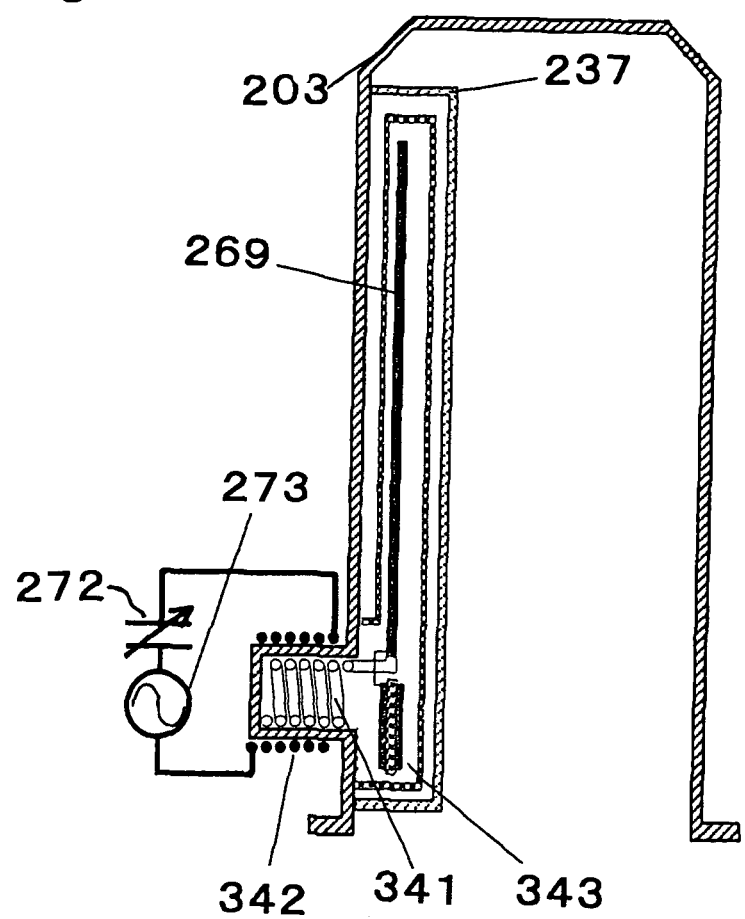
FIG. 19 is a schematic vertical sectional view taken along the line J-J in FIG. 18.
Figure 20:
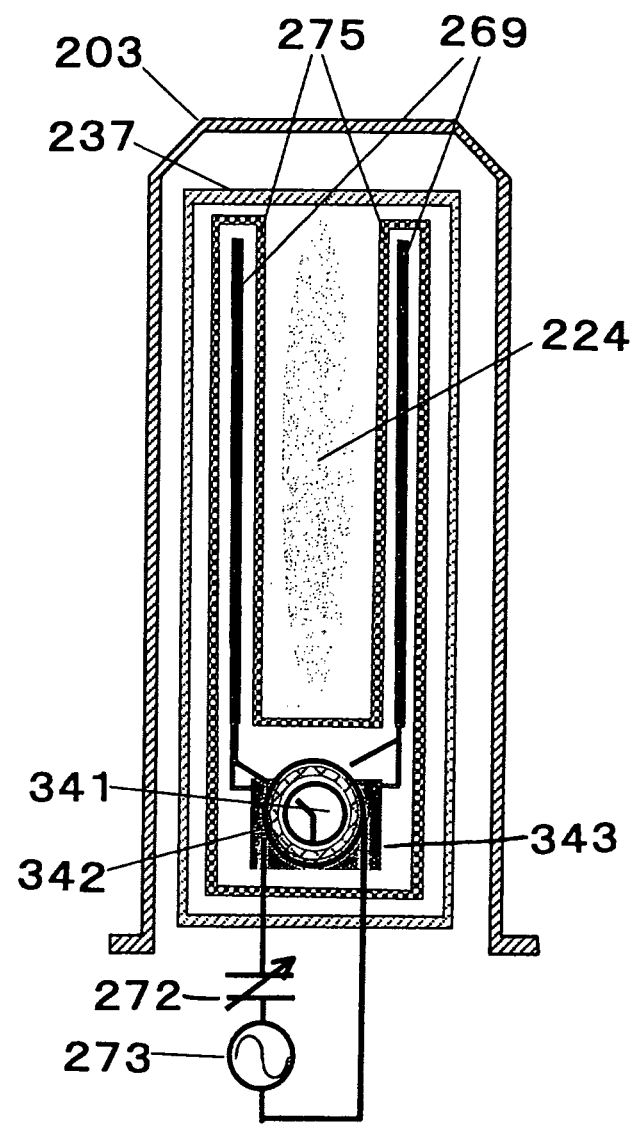
FIG. 20 is a schematic vertical sectional view taken along the line K-K in FIG. 18.

Referring to FIGS. 18 to 20, the two discharge electrodes 269 are connected to a coupling coil 341 at a lower portion of the reaction tube 203. The discharge electrodes 269 are covered with the dielectric tube 275 and the inner wall of the reaction tube 203. The coupling coil 341 is disposed in a form of solenoid along the inner wall of the quartz projected in a columnar shape from the wall of the reaction tube. The resonance capacitor 343 is disposed at a backdeep of the coupling coil 341, and the electrodes of the resonance capacitor 343 is connected to the coupling coil 341.

Figure 21:
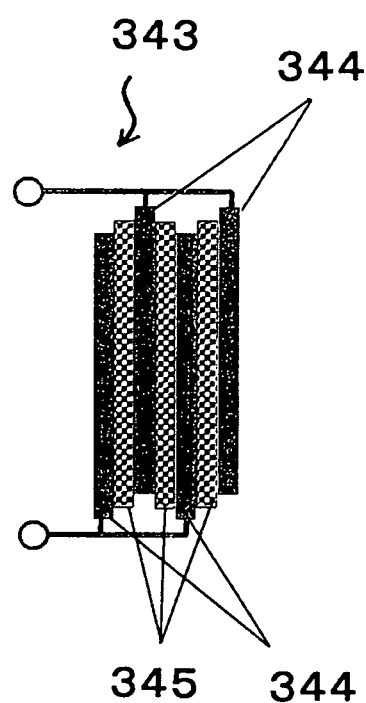
FIG. 21 is a schematic vertical sectional view for explaining a structure of a resonance capacitor 343 used in the substrate processing apparatus of the preferred fifth embodiment of the present invention.

The resonance capacitor 343 is disposed in the reaction tube, and is heated to a temperature as high as 600° C. Therefore, quartz plates 345 of about 2 to 5 mm are respectively sandwiched between sheets 344 of a metal having a high melting point such as Ni as shown in FIG. 21. An area of the metal sheet, and the number of laminated metal sheets or quartz sheets are adjusted in accordance with a necessary capacity.

Figure 22:
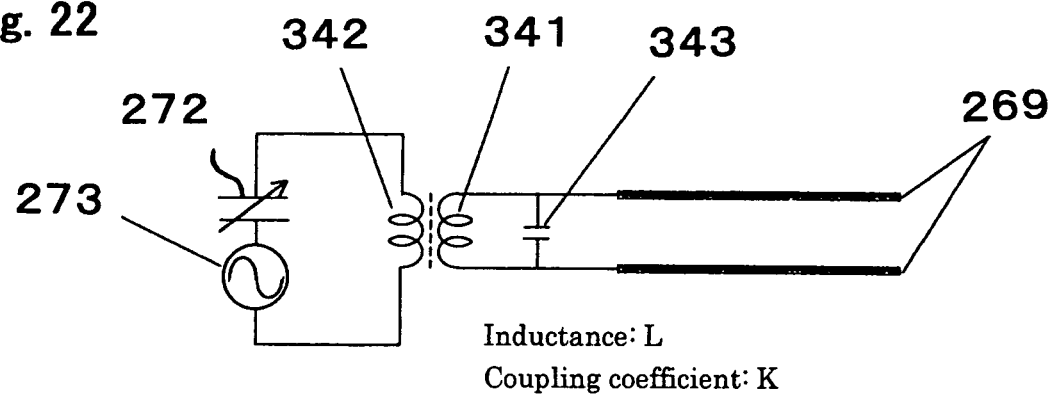
FIG. 22 is a circuit diagram of a discharge electric power supply circuit used in the substrate processing apparatus of the preferred fifth embodiment of the invention.
Figure 23:
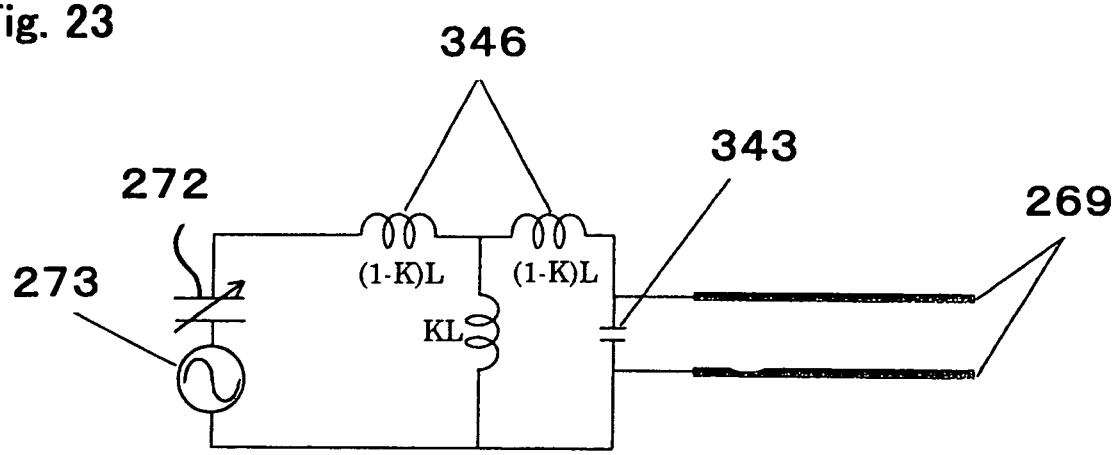
FIG. 23 is an equivalent circuit diagram in FIG. 22.

FIG. 22 is a circuit diagram, and FIG. 23 shows an equivalent circuit. If inductances of the induction coil 342 and the coupling coil 341 are defined as "L", and coupling coefficients of the induction coil 342 and the coupling coil 341 are defined as "K", a leakage inductance is expressed as "(1−K) L". When there is an insulator such as quartz between the induction coil 342 and the coupling coil 341 in this manner, the coupling coefficient K is small and the leakage inductance 346 becomes large. When the leakage inductance 346 and the resonance capacitor 343 are not in a resonance state, applied voltage from the oscillator 273 is simply divided by the leakage inductance 346 and the resonance capacitor 343. Therefore, voltage sufficient for a plasma electrode 269 is not applied.

When the leakage inductance 346 and the resonance capacitor 343 are in the resonance state, magnetic energy of current flowing through the leakage inductance 346 is converted into electric field energy by resonance phenomenon, and it is converted into voltage between terminals of the resonance capacitor 343. With this, the supply electric power from the oscillator 273 efficiently becomes energy for producing plasma.

When capacitance itself between the discharge electrodes 269 can be regarded as the resonance capacitor (when leakage inductance 346 and capacitance between the discharge electrodes 269 are in a resonance state), the external resonance capacitor 343 is unnecessary.

As a means for maintaining the resonance state of the leakage inductance 346 and the resonance capacitor 343, there is a method in which oscillation frequency of the oscillator 273 is adjusted in accordance with a phase difference between voltage and current applied to the induction coil 342 so that the oscillation frequency is made equal to the resonance frequency, or the leakage inductance is changed by adjusting the position of the induction coil 342 with respect to the coupling coil 341 so that the resonance frequency is made equal to the oscillation frequency.

As explained above, according to the preferred embodiments, the discharge electrodes are sealed in the reaction tube, thereby preventing oxygen from being mixed into from outside, and deterioration of the electrodes by oxidation can be prevented.

Since there is no electrical contact with the electrodes, it is possible to prevent the discharge electrode ends from being damaged at the time of maintenance of the reaction tube.

If the resonance capacitor is added on the secondary side of the coupling coil and the electric power is transferred in the resonance state as in the fifth embodiment, it is possible to efficiently transfer electric power to the coupling coil from the induction coil.

Since the electrodes are air-tightly sealed in the protection container, the maintenance operation or the exchanging operation of the electrodes becomes unnecessary. With this, since it becomes unnecessary to detach the electrodes at the time of maintenance, a trouble (problem that repeatability of electrode position does not appear) caused when the electrodes are again inserted is not generated.

Since the electrodes are air-tightly sealed in the protection container and thus it becomes unnecessary to detach the electrodes, and therefore simple rod-like electrodes can be used. It is unnecessary to employ the weaved structure for obtaining flexibility like the above-described Japanese Patent Application No. 2004-055446 (International Application No. PCT/JP 2005/002306), and it is only necessary that the surface areas are the same.

By the dielectric coupling or electrostatic coupling, abnormal discharge in the reaction chamber can be suppressed like the case where electric power is supplied through a power transformer of the prior application of Japanese Patent Application No. 2003-056772 (International Application No. PCT/JP 2004/002735, International Laid-open No. WO2004/079813).

The entire disclosure of Japanese Patent Application 2004-379002 filed on Dec. 28, 2004 including description, claims, drawings and abstract are incorporated herein by reference.

While various typical embodiments of the present invention have been shown and described, the present invention is not limited to these embodiments. Thus, the scope of the invention can only be limited by the following claims.

As described above, the deterioration of discharge electrodes for plasma-exciting the processing gas can be prevented or restrained, and the lifetime of the discharge electrodes can be increased according to preferred embodiments of the present invention. Hence, the present invention is particularly suitable for a substrate processing apparatus for plasma-exciting processing gas to process a substrate.

What is claimed is:

1. A substrate processing apparatus, comprising:
a reaction tube;
a processing chamber formed inside the reaction tube to accommodate one or more substrates;
a heating section disposed such as to surround the processing chamber from outside;
a gas supply section to supply processing gas into the processing chamber;
a gas discharge section to discharge the processing gas from the processing chamber;
a protection container accommodated inside the reaction tube and made of dielectric;
at least a pair of electrodes provided and air-tightly sealed in the protection container to plasma-excite the processing gas;
an electricity-receiving section which is electrically connected to the electrodes and which is accommodated and air-tightly sealed in the protection container; and
an electricity-feeding section to which high frequency electric power is applied and which is provided near the electricity-receiving section in a state in which at least a wall of the protection container is interposed between the electricity-receiving section and the electricity-feeding section, wherein
electric power is supplied from the electricity-feeding section to the electricity-receiving section by electromagnetism coupling by way of the wall of the protection container.

2. The substrate processing apparatus as claimed in claim 1, wherein a plasma generating region to plasma-excite the processing gas is formed outside the protection container.

3. The substrate processing apparatus as claimed in claim 1, wherein the processing chamber is made of quartz.

4. The substrate processing apparatus as claimed in claim 1, wherein at least a portion of the wall of the protection container is formed of a portion of a wall of the reaction tube.

5. The substrate processing apparatus as claimed in claim 1, wherein an inert gas is charged into the protection container, to cause a pressure in the protection container to be 100 Torr or higher.

6. The substrate processing apparatus as claimed in claim 5, wherein a pressure in the protection container is equal to an atmospheric pressure or higher.

7. The substrate processing apparatus as claimed in claim 1, wherein the electricity-receiving section is a coupling coil connected between the pair of electrodes, and the electricity-feeding section is an induction coil which is inductively coupled to the coupling coil.

8. The substrate processing apparatus as claimed in claim 7, further comprising a resonance capacitor section between the pair of electrodes.

9. The substrate processing apparatus as claimed in claim 8, wherein the resonance capacitor section is a capacitor formed by sandwiching a quartz plate between metal plates.

10. The substrate processing apparatus as claimed in claim 8, wherein the resonance capacitor section includes a plurality of capacitors in layers each formed by sandwiching a quartz plate between metal plates.

11. A substrate processing apparatus, comprising:
  a reaction tube;
  a processing chamber formed inside the reaction tube to accommodate one or more substrates;
  a heating section disposed such as to surround the processing chamber from outside;
  a gas supply section to supply processing gas into the processing chamber;
  a gas discharge section to discharge the processing gas from the processing chamber;
  a protection container accommodated inside the reaction tube and made of dielectric;
  at least a pair of electrodes provided and air-tightly sealed in the protection container to plasma-excite the processing gas;
  an electricity-receiving section which is electrically connected to the electrodes and which is accommodated and air-tightly sealed in the protection container; and
  an electricity-feeding section to which high frequency electric power is applied and which is provided near the electricity-receiving section in a state in which at least a wall of the protection container is interposed between the electricity-receiving section and the electricity-feeding section, wherein electric power is supplied from the electricity-feeding section to the electricity-receiving section by electromagnetism coupling by way of the wall of the protection container, wherein the electricity-receiving section is electrostatic coupling plates respectively connected to the pair of electrodes, the electrostatic coupling plates being physically separated from each other, and the electricity-feeding section is electric power supply plates respectively opposed to the electrostatic coupled plates, the electric power supply plates being physically separated from each other.

* * * * *